United States Patent
Huang

(10) Patent No.: US 7,429,946 B2
(45) Date of Patent: Sep. 30, 2008

(54) CAPACITOR AVERAGING CONVERTER

(75) Inventor: Yi Ti Huang, Jhubei (TW)

(73) Assignee: Infineon Technologies AG, Neubiberg ( * ) Notice: Subject to any disclaimer, the term of this patent is extended or adjusted under 35 U.S.C. 154(b) by 0 days.

(21) Appl. No.: 11/633,892

(22) Filed: Dec. 5, 2006

(65) Prior Publication Data

US 2008/0129575 A1    Jun. 5, 2008

(51) Int. Cl.
H03M 1/12 (2006.01)
(52) U.S. Cl. .................... 341/172; 341/122
(58) Field of Classification Search ............. 341/142, 341/155, 161, 172, 122
See application file for complete search history.

(56) References Cited

U.S. PATENT DOCUMENTS 6,342,919 B2 * 1/2002 Opris ................ 348/241

2004/0012697 A1 * 1/2004 Rossi ................ 348/308
2006/0061502 A1   3/2006 Masato et al.

OTHER PUBLICATIONS

Bang-Sup Song, Michael F. Tompsett, Kadaba R. Lakshmikumar; A 12-bit 1-Msample/s Capacitor Error-Averaging Pipelined A/D Converter; IEEE Journal of Solid-State Circuits; Dec. 1998; vol. 23, No. 6.
Hsin-Shu Chen, Bang-Sup Song, Kantilal Bacrania; A 14-b 20-MSamples/s CMOS Pipelined ADC; IEEE Journal of Sold-State Circuits; Jun. 2001; vol. 36, No. 6.
Yun Chiu, Paul R. Gray, Borivoje Nikolié; A 14-b 12-MS/s CMOS Pipeline ADC With Over 100-dB SFDR; IEEE Journal of Solid-State Circuits; Dec. 2004; vol. 39, No. 12.

* cited by examiner

Primary Examiner—Peguy JeanPierre
(74) Attorney, Agent, or Firm—Lee & Hayes, PLLC

(57) ABSTRACT

A capacitor-averaging pipeline analog-to-digital converter has a plurality of stages. Each of the plurality of stages has a first switched capacitor circuit and a second switched capacitor circuit parallel with the first switched capacitor circuit. A corresponding method is also disclosed.

14 Claims, 5 Drawing Sheets

CAPACITOR AVERAGING CONVERTER

BACKGROUND

1. Field of the Invention

This invention relates to capacitor averaging converters and more particularly, though not exclusively, to capacitor averaging pipeline analog-to-digital converters.

2. Description of Related Art

In past 20 years, highly accurate data conversion using pipeline architecture has been studied and developed. Both analog compensation and digital calibration schemes were successfully proposed to achieve high accuracy—up to 15 b resolution. The main effort regarding analog compensation schemes has been to compensate the capacitor mismatch of switched-capacitor pipeline stages, which is a limitation on the high resolution pipeline analog to digital converter (ADC) designs.

One technique used a dedicated opamp-based switched-capacitor stage to perform charge averaging in a separate averaging phase. Unfortunately, this first technique had high power consumption, and its operating speed was limited to 20 Msps. In part, the first of these problems was due to the active averaging technique that relied on an opamp-based feedback network, which consumes large quantities of power. Also, this first technique must operate in at least three clocks phases for residual signal generation. As a result, large currents were drained, and the data conversion rate was significantly slower.

As shown in FIGS. 1 and 2, another technique proposed was a passive capacitor averaging scheme to cut down power dissipation. This technique twice samples the residual signal into two nominally identical capacitors of the next pipeline stages. The charges on the two capacitors are redistributed in an averaging manner among the shorted capacitors in the next clock phase. This is done by an opamp-based switched capacitor circuit, completing the averaging process. The switched capacitor circuit was also used as residual amplifier. As a result, no dedicated averaging stage is required for the structure, thus saving power. Also, only a few switches were added to control the double sampling of residual signals.

Still referring to FIGS. 1 and 2, four clock phases are required to output one residual signal from each pipeline stage. For pipeline stage-(i), during sampling phase $\Phi_1$, switches S1 and S2 are closed to acquire an input signal. Switches S3 & S4 are also closed for bottom-plate sampling. One additional sampling phase $\Phi_2$ (or comparison phase) may be used to perform sub-ADC data conversion within each pipeline stage. $\Phi_1$ & $\Phi_2$ schematics are not shown). This is preferable but not mandatory as other comparison techniques can be used to eliminate the need for the additional phase $\Phi_2$. In these two clock phases, the associated opamp is idle.

During amplification phase $\Phi_3$, the sampling switches S1, S2, S3 and S4 are open and isolate the switched capacitor circuit from an input signal. At almost the same time, switches S0 & S5 are closed and a loop is formed around the opamp for residual amplification with gain of (1+C1S1/C1S2). The stage (i+1) is sampling the residual signal from stage (i) into a capacitor C1S2. In the last phase $\Phi_4$, the capacitors C1S1 and C2S1 are swapped to provide a slightly different gain of (1+C2S1/C1S1). This will be different to the gain (1+C1S1/C1S2) because of inherent capacitor mismatch between C1S1 and C2S2. The stage (i+1) is again sampling the signal into another sampling capacitor C2S2. In this way, the charges on the two capacitors can be redistributed later by a switched capacitor circuit and the resultant compensated residual signal can be obtained. This will be subject only to the second-order error, which is very small and is normally of the order of about $10^{-6}$. Accordingly, the averaging process needs at least three clock phases to operate properly, thereby slowing the operation. Therefore, there is a need for an improved capacitor averaging converter.

SUMMARY

According to an exemplary embodiment, there is provided a capacitor-averaging pipeline analog-to-digital converter having a plurality of stages. Each of the plurality of stages has a first switched capacitor circuit and a second switched capacitor circuit parallel with the first switched capacitor circuit.

The second switched capacitor circuit may be the same as the first switched capacitor circuit. Preferably, the second switched capacitor circuit is exactly the same as the first switched capacitor circuit.

The first switched capacitor circuit of one of the plurality of stages may be the same as the first switched capacitor circuit of a second of the plurality of stages. Alternatively, it may be different. The second switched capacitor circuit of the one stage may be the same as the second switched capacitor circuit of the second stage. Alternatively, it may be different.

The second switched capacitor circuit may be for simultaneous residual signal amplification and averaging when the first switched capacitor circuit is sampling an input signal; and the first switched capacitor circuit may be for simultaneous residual signal amplification and averaging when the second switched capacitor circuit is sampling the input signal.

The converter may further comprise an operational amplifier for each of the plurality of stages. Outputs of the first and second switched capacitor circuits may be input to the operational amplifiers, the operational amplifiers being continuously operational during conversion.

Each of the plurality of stages may be able to operate in a two-phase clock scheme. For every two phases there may be one residual signal generated.

According to another exemplary embodiment, there is provided a method of converting an analog signal to a digital signal. During a first phase of a clock cycle an input signal is sampled at a first switched capacitor circuit of a first stage of a plurality of stages of a capacitor-averaging pipeline analog-to-digital converter. Residual amplification and averaging of an earlier input signal sampled from a previous phase of the clock cycle is performed at a second switched capacitor circuit of the first stage of the plurality of stages of the capacitor-averaging pipeline analog-to-digital converter. During a second phase of the clock cycle the input signal is sampled at the second switched capacitor circuit, and residual amplification and averaging of the input signal sampled from the previous phase of the clock cycle is performed at the first switched capacitor circuit. The averaged residual signal from the first stage may be input to a second stage of the plurality of stages.

During the first phase of the clock cycle: the averaged residual signal generated from the first stage may be sampled into a first switched capacitor circuit of the second stage, and an earlier averaged residual signal sampled from a previous phase of the clock cycle may be amplified and averaged at a second switched capacitor circuit of the second stage. During the second phase of the clock cycle: the averaged residual signal generated from the first stage may be sampled into the second switched capacitor circuit of the second stage, and the averaged residual signal sampled from the previous phase of the clock cycle may be amplified and averaged at the first switched capacitor circuit of the second stage.

Each of the plurality of stages of the capacitor-averaging pipeline analog-to-digital converter may comprise an operational amplifier. For each of the plurality of stages outputs of the first switched capacitor circuit and the second switched capacitor circuit may be input to the operational amplifier, and the operational amplifier may be in continuous operational during conversion. Each of the plurality of stages may operate in a two-phase clock scheme.

DETAILED DESCRIPTION

Figure 1:
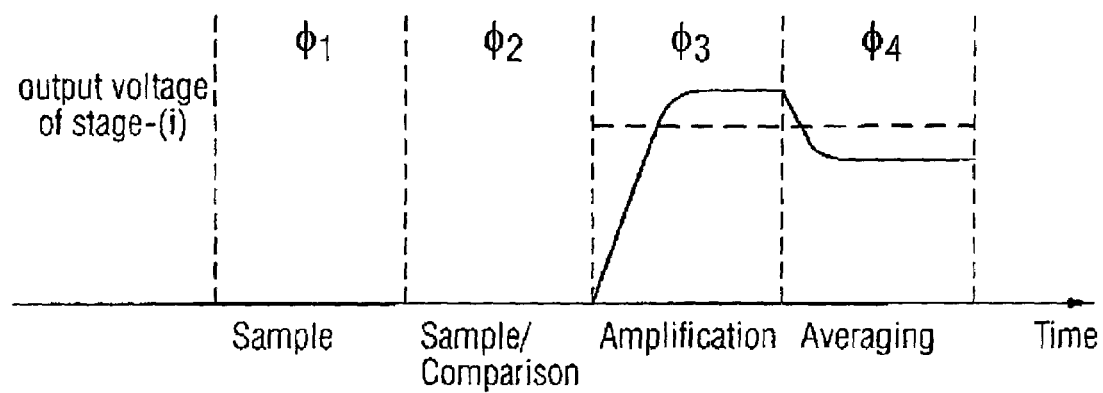
FIG. 1 is a timing diagram of four-phase operation in a prior art design.
Figure 2:
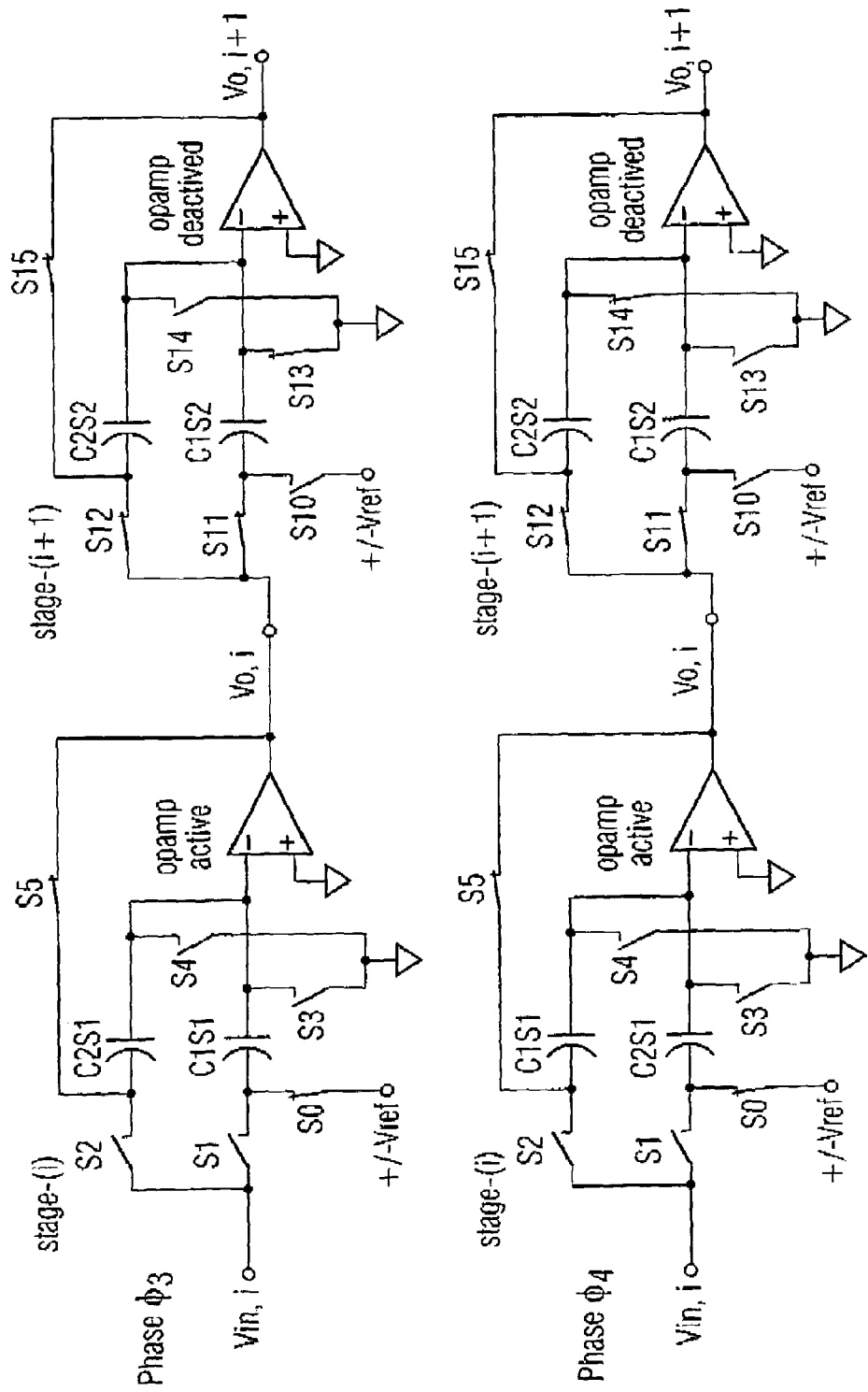
FIG. 2 is an illustrative circuit of a prior art design for pipeline stages in phases $\Phi_3$ and $\Phi_4$.
Figure 3:
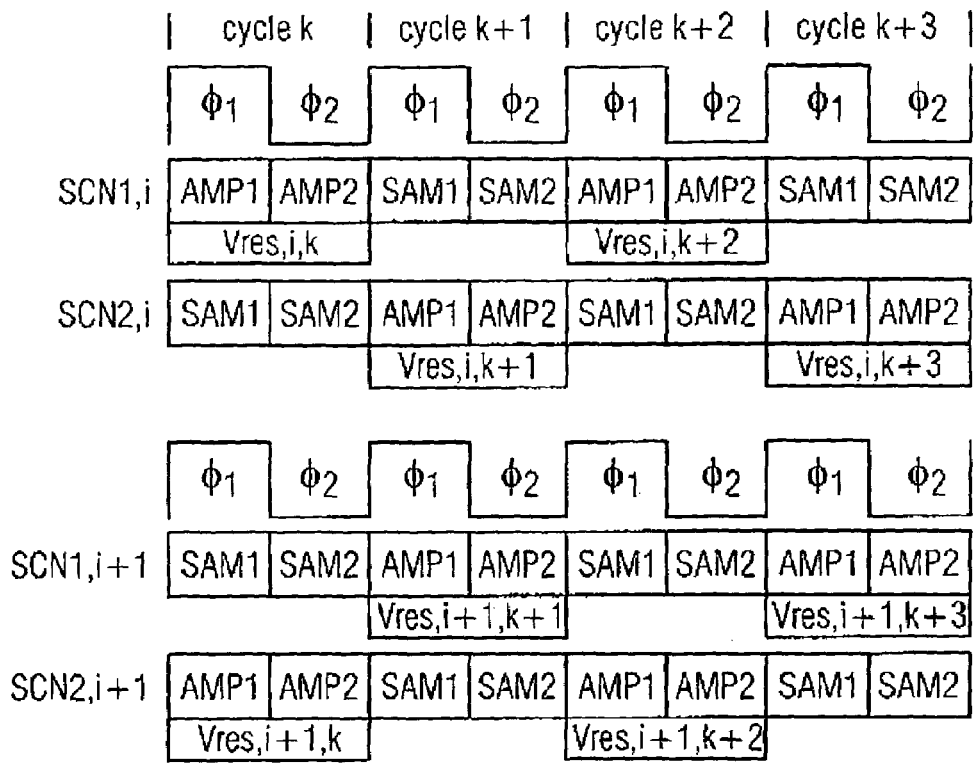
FIG. 3 is a timing diagram of an embodiment of the invention in 2-phase operation.
Figure 4:
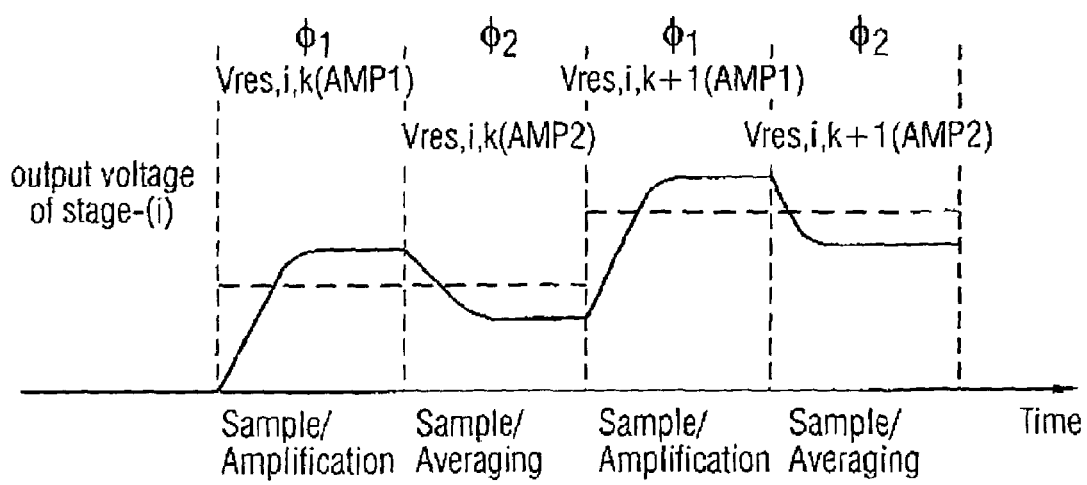
FIG. 4 is a graph of pipeline stage residual output voltage.

As shown in FIGS. 3 and 4, a 2-phase capacitor averaging scheme in a 1.5 b/stage structure is shown with the sampling-only phases removed. One additional switched capacitor circuit SCN2$i$ for the first stage i, and SCN2$i$+1 for the second stage i+1, is added at the sample phase for simultaneous residual signal amplification. In this way, no opamp is idle, and all the pipeline stages can operate in a 2-phase clock scheme. For every two phases there is one residual signal $V_{O(i+1)}$ generated such that the overall result of all pipeline stages is a higher throughput and therefore a higher data conversion rate. The operation of the embodiment is set-out below.

FIG. 3 is a timing diagram of 2-phase operation. SCN1,$i$ and SCN2,$i$ are the two switched-capacitor circuits for stage i; SCN1,$i$+1 and SCN2,$i$+1 are the two switched capacitor circuits for stage i+1. Vres,i,k and Vres, i+1,k+1 represent the same signal sample but are processed in different stages. The same applies to Vres,i,k+2 and Vres,i+1,k+3; Vres,i,k+1 and Vres,i+1,k+2. The amplification mode means both amplification and hold operations.

FIG. 4 is a graph of pipeline stage residual output voltage during transience. There are two amplification/hold phases AMP1 and AMP2 for each clock cycle. At the same time the sampling operation is under way and thus there are two sampling operations SAM 1 and SAM2 for each clock cycle. The difference of residual output signal values Vres,i,k(AMP1) and Vres,i,k(AMP2) here are shown exaggerated for illustration. Similarly for Vres,i,k+1(AMP1) and Vres,i,k+1 (AMP2).

Vres,i,k is the output voltage for both AMP 1 and AMP2 in FIG. 3 is not exactly correct. There are slight difference in the values of the residual output signals in AMP1 and AMP2 modes: Vres,i,k(AMP1) and Vres,i,k(AMP2) differ by a factor (1+C1/C2)/(1+/C2/C1), as shown in FIG. 4. That will generally be removed in the next pipeline stage. But for simplification of the explanation of the operation, the same name will be used.

Figure 5A:
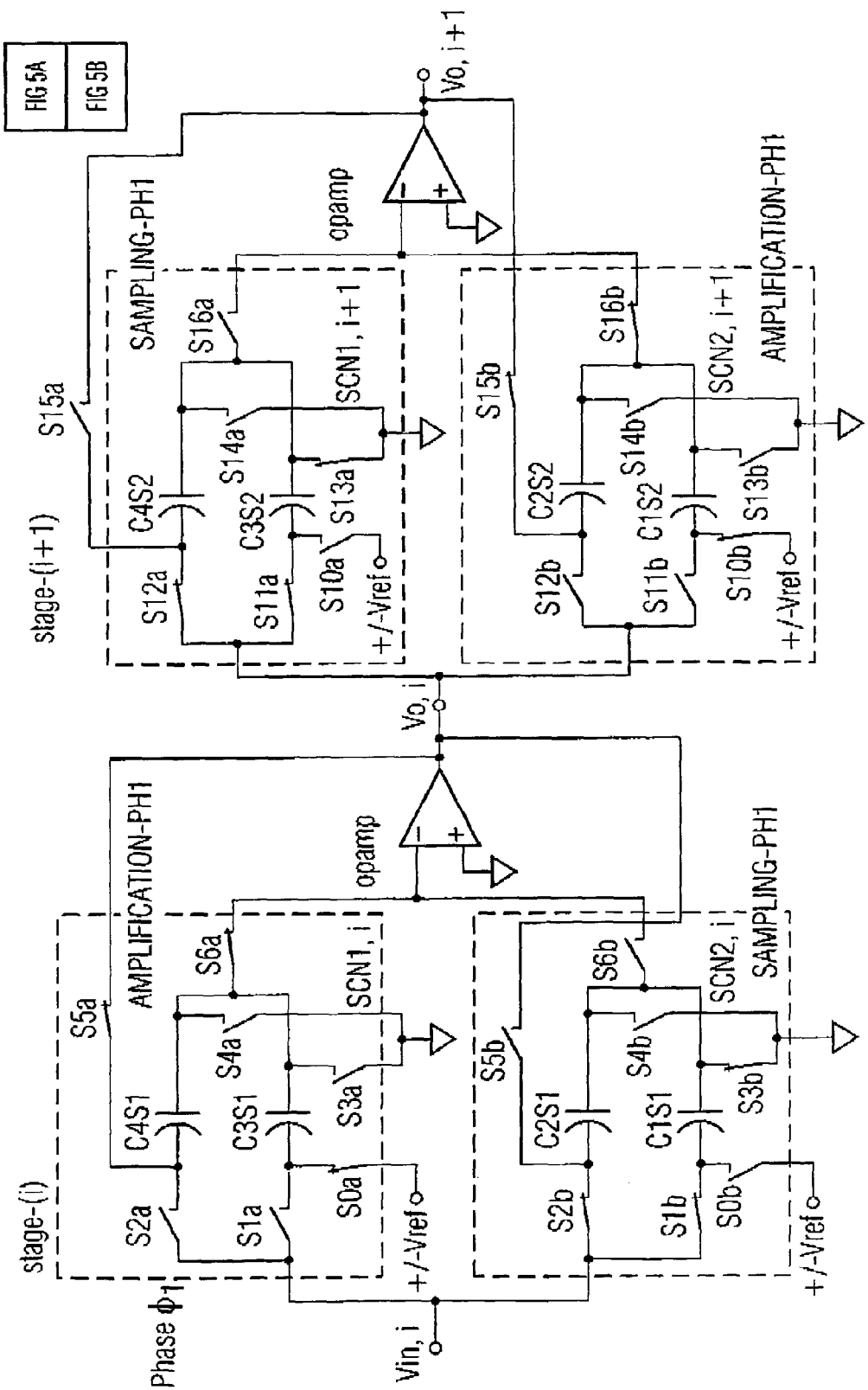
FIG. 5 is an illustrative circuit of an exemplary embodiment of the invention for pipeline stages in phases $\Phi_1$ and $\Phi_2$.
Figure 5B:
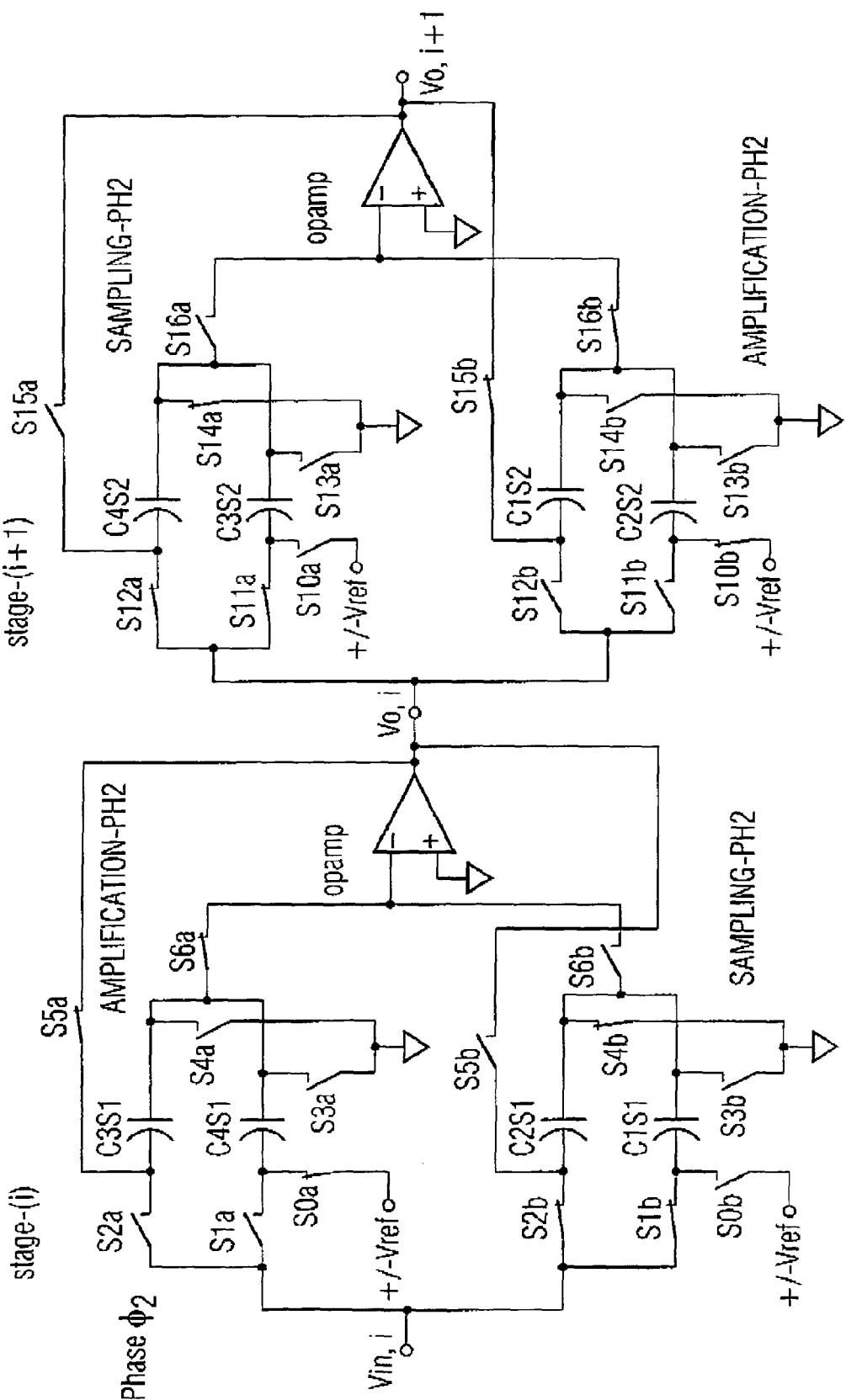

In FIG. 5, the additional switched capacitor circuit SCN2,$i$ is added to and is parallel with the original switched capacitor circuit SCN1,$i$ for the first pipeline stage (i), and the additional switched capacitor circuit SCN2,$i$+1 is added to and is parallel with the original switched capacitor circuit SCN1, i+1 for the next stage (i+1). Input Vin,i is operatively connected to circuit SCN1,$i$ through its switches S1$a$ and S2$a$; and to circuit SCN2 via its switches S1$b$ and S2$b$.

The output of each switched capacitor circuit SCN1,$i$ and SCN2,$i$, as well as SCN1,$i$+1 and SCN2,$i$+1, is input to an operational amplifier ("opamp") in each stage i and i+1. As such, for each pipeline stage, there is one opamp associated with the two switched capacitor circuits. Therefore, the opamps are always active as they amplify the sampled signal twice. The data throughput is then equivalent to that of conventional pipeline ADCs because of the same 2-phase clock scheme. This makes it possible to achieve high resolution capacitor averaging ADCs capable of operating at high speed. Each switched capacitor circuit is operatively connected to the opamp via a switch. SCN1 is operatively connected to S6$a$ and SCN2 is operatively connected to S6$b$. SCN1, i+1 is operatively connected to S16$a$ and SCN2, i+1 is operatively connected to S16$b$.

As shown in FIG. 5, the opamp in stage (i) will output averaged (compensated) residual signals Vres,i,k, Vres, i,k+2, and so forth, every even-numbered clock phase k, k+2, and so forth; and every two phases k+1, k+3 and so forth will output an averaged (compensated) residual signal Vres,i,k+1, Vres,i,k+3, and so forth, (shown as Vo,i on FIG. 5) that is input to the next pipeline stage (i+1).

In this exemplary embodiment, instead of sampling only in phase $\Phi_1$ and phase $\Phi_2$, amplification and averaging operations are also executed to increase the conversion rate. The averaging operation is embedded in double sampling mode.

Each additional switched capacitor circuit SCN2, SCN2, i+1 is preferably the same as (i.e. is a replica of) the original switched capacitor circuit SCN1, SCN1, i+1, respectively. More preferably, and within normal manufacturing tolerances, each additional switched capacitor circuit SCN2, SCN2, i+1 is exactly the same as (i.e. is an exact replica of) the original switched capacitor circuit SCN1, SCN1, i+1 respectively. The original switched capacitor circuit SCN1 of one stage is preferably the same as the original switched capacitor circuit of the next stage SCN1, i+1; however, they may be different. The additional switched capacitor circuit SCN2 of one stage is preferably the same as the additional switched capacitor circuit of the next stage SCN2, i+1; however, they may be different.

During phase $\Phi_1$, the switched capacitor circuit SCN1,$i$ of stage (i) is sampling the input signal Vin,i. As shown, S1$b$, S2$b$ and S3$b$ are closed to acquire input the signal $V_{in,i}$ into C1S1. For the other switched capacitor circuit SCN2,$i$ of stage i, the switches S0$a$, S5$a$ and S6$a$ are closed for residual amplification with a gain of (1+C3S1/C4S1). S0$a$ is closed for subtraction.

For stage (i+1), the residual signal Vres,i,k ($V_{O,i}$) from stage (i) is sampled into C3S2 of switched capacitor circuit SCN1,$i$+1. The other switched capacitor circuit SCN2,$i$+1 is amplifying the residual signal sampled from the previous clock cycle with gain of (1+C2S2/C1S2).

During phase $\Phi_2$, switched capacitor circuit SCN2,$i$ is still sampling the input signal $V_{in,i}$, this time with S1$b$, S2$b$ and S4$b$ being closed to acquire input signal into C2S1. For the other switched capacitor circuit SCN1,$i$ switches S0$a$, S5$a$ and S6$a$ are again closed for residual amplification but now with a gain of (1+C4S1/C3S1) because of capacitor swapping.

For stage (i+1), the residual signal Vres,i,k ($V_{O,i}$) from stage (i) is sampled into C4S2 in SCN1,$i$+1. The other switched capacitor circuit SCN2,$i$+1 is amplifying the residual signal sampled from the previous clock cycle with a gain of (1+C2S2/C1 S2).

In stage i, switch S6a is closed for both phases $\Phi_1$ and $\Phi_2$ in the amplification mode with different gains of (1+C3S1/C4S1) during phase $\Phi_1$ and (1+C4S1/C3S1) during phase $\Phi_2$, respectively. In this way, there can be compensation for mismatch of the two capacitors in the next pipeline stage. This also applies to sampling phase, in which switches S5b and S6b are open; and C2S1 and C1S2 alternate in obtaining sampled signals.

For the next 2 phases of the clock cycle, the two switched capacitor circuits of each pipeline stage i and i+1 respectively work in a time-interleaving manner. Therefore, all pipeline stages i and i+1 can run concurrently with 2 clocks phases only, with the output residual signals being available in every clock cycle. As such, the 2-clock phase scheme enables pipeline ADCs to run at high speed thereby addressing the multi-phase constraint imposed by the capacitor averaging technique. Also, power consumption is reduced because no opamp is idle during the conversion process.

As a person skilled in the art will readily appreciate, the above description is meant as an illustration of implementation of the principles of this invention. This description is not intended to limit the scope or application of this invention in that the invention is susceptible to modification, variation and change, without departing from the spirit of this invention, as defined in the following claims.

The invention claimed is:

1. A capacitor-averaging pipeline analog-to-digital converter comprising a plurality of stages, each of the plurality of stages comprising a first switched capacitor circuit and a second switched capacitor circuit parallel with the first switched capacitor circuit, wherein each of the plurality of stages is able to operate in a two-phase clock scheme and for every two phases there is one residual signal generated.

2. The converter as claimed in claim 1, wherein the second switched capacitor circuit is the same as the first switched capacitor circuit.

3. The converter as claimed in claim 1, wherein the second switched capacitor circuit is exactly the same as the first switched capacitor circuit.

4. The converter as claimed in claim 1, wherein the first switched capacitor circuit of one of the plurality of stages is the same as the first switched capacitor circuit of a second of the plurality of stages.

5. The converter as claimed in claim 4, wherein the second switched capacitor circuit of the one stage is the same as the second switched capacitor circuit of the second stage.

6. The converter as claimed in claim 1, wherein the first switched capacitor circuit of one of the plurality of stages is different from the first switched capacitor circuit of a second of the plurality of stages.

7. The converter as claimed in claim 6, wherein the second switched capacitor circuit of the one stage is different to the second switched capacitor circuit of the second stage.

8. A capacitor-averaging pipeline analog-to-digital converter comprising a plurality of stages, each of the plurality of stages comprising a first switched capacitor circuit and a second switched capacitor circuit parallel with the first switched capacitor circuit wherein the second switched capacitor circuit is for simultaneous residual signal amplification and averaging when the first switched capacitor circuit is sampling an input signal, and the first switched capacitor circuit is for simultaneous residual signal amplification and averaging when the second switched capacitor circuit is sampling an input signal.

9. The converter as claimed in claim 8 further comprising an operational amplifier for each of the plurality of stages, wherein for each of the plurality of stages outputs of the first switched capacitor circuit and the second switched capacitor circuit are configured to be input to the operational amplifier, the operational amplifier being configured for continuous operational during conversion.

10. A method of converting an analog signal to a digital signal, the method comprising:
   during a first phase of a clock cycle: sampling an input signal at a first switched capacitor circuit of a first stage of a plurality of stages of a capacitor-averaging pipeline analog-to-digital converter, and performing residual amplification and averaging of an earlier input signal sampled from a previous phase of the clock cycle at a second switched capacitor circuit of the first stage of the plurality of stages of the capacitor-averaging pipeline analog-to-digital converter;
   during a second phase of the clock cycle: sampling the input signal at the second switched capacitor circuit, and performing residual amplification and averaging of the input signal sampled from the previous phase of the clock cycle at the first switched capacitor circuit.

11. The method as claimed in claim 10, wherein an averaged residual signal from the first stage is input to a second stage of the plurality of stages.

12. The method as claimed in claim 11, wherein
   during the first phase of the clock cycle: the averaged residual signal generated from the first stage is sampled into a first switched capacitor circuit of the second stage, and an earlier averaged residual signal sampled from a previous phase of the clock cycle is amplified and averaged at a second switched capacitor circuit of the second stage;
   during the second phase of the clock cycle: the averaged residual signal generated from the first stage is sampled into the second switched capacitor circuit of the second stage, and the averaged residual signal sampled from the previous phase of the clock cycle is amplified and averaged at the first switched capacitor circuit of the second stage.

13. The method as claimed in claim 10, wherein each of the plurality of stages of the capacitor-averaging pipeline analog-to-digital converter comprises an operational amplifier, for each of the plurality of stages outputs of the first switched capacitor circuit and the second switched capacitor circuit are input to the operational amplifier, the operational amplifier being in continuous operational during conversion.

14. The method as claimed in claim 10, wherein each of the plurality of stages operates in a two-phase clock scheme.

* * * * *